US012212121B2

(12) United States Patent
Guenter et al.

(10) Patent No.: US 12,212,121 B2
(45) Date of Patent: Jan. 28, 2025

(54) BOTTOM EMITTING VCSEL (71) Applicant: II-VI Delaware, Inc., Wilmington, DE (US)

(72) Inventors: James K. Guenter, Garland, TX (US); Hao Chen, Allen, TX (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 18/480,067

(22) Filed: Oct. 3, 2023

(65) Prior Publication Data
US 2024/0030684 A1  Jan. 25, 2024

Related U.S. Application Data (63) Continuation of application No. 16/858,135, filed on Apr. 24, 2020, now Pat. No. 11,811,197.

(60) Provisional application No. 62/839,147, filed on Apr. 26, 2019.

(51) Int. Cl.
*H01S 5/183* (2006.01)
*H01S 5/343* (2006.01)

(52) U.S. Cl.
CPC ...... *H01S 5/18305* (2013.01); *H01S 5/18308* (2013.01); *H01S 5/18358* (2013.01); *H01S 5/18361* (2013.01); *H01S 5/34313* (2013.01); *H01S 2304/04* (2013.01)

(58) Field of Classification Search
CPC ............ H01S 5/18305; H01S 5/18358; H01S 5/18361
See application file for complete search history.

(56) References Cited

U.S. PATENT DOCUMENTS

| 5,493,577 | A | | 2/1996 | Choquette et al. |
| 6,014,400 | A | | 1/2000 | Kobayashi |
| 6,067,309 | A | * | 5/2000 | Onomura ............ H01S 5/0421 372/45.01 |
| 2005/0243889 | A1 | | 11/2005 | Kim et al. |

(Continued)

FOREIGN PATENT DOCUMENTS

| JP | 2009102630 A | 5/2009 |
| WO | 0079599 A1 | 12/2000 |

OTHER PUBLICATIONS

"machine translation of JP-09102630-A (Year: 1994)".

*Primary Examiner* — Yuanda Zhang
(74) *Attorney, Agent, or Firm* — Blank Rome LLP (57) ABSTRACT A VCSEL can include: a substrate that passes light therethrough; a phase matching layer over a top mirror stack; a first metal layer over the phase matching layer; and an end metal region over the first metal layer. The phase matching layer and first metal layer have a cooperative thickness to provide reflectivity of at least a predetermined reflectivity threshold for the emission wavelength. A method of making a VCSEL can include: providing a substrate; forming a first mirror stack above the substrate; forming an active region above the first mirror stack; and forming a reflective end above the active region, the reflective end having a phase matching layer and a first metal layer. The phase matching layer and first metal layer have a combined thickness for the reflective end to have a reflectivity of at least a predetermined reflectivity threshold for an emission wavelength of the VCSEL.

21 Claims, 5 Drawing Sheets (56) References Cited

U.S. PATENT DOCUMENTS

2008/0023688 A1* 1/2008 Johnson ............ H01S 5/18308
257/E29.09
2018/0198254 A1 7/2018 Tatum et al.

* cited by examiner

BOTTOM EMITTING VCSEL

CROSS-REFERENCE TO RELATED APPLICATIONS

This application is a continuation of U.S. patent application Ser. No. 16/858,135, filed Apr. 24, 2020, which claims priority to U.S. Provisional App. No. 62/839,147 filed on Apr. 26, 2019, which is incorporated herein by reference.

FIELD

The embodiments discussed herein are related to a bottom emitting VCSEL with a phase matching metal end region opposite of an emitting end.

BACKGROUND

Unless otherwise indicated herein, the materials described herein are not prior art to the claims in the present application and are not admitted to be prior art by inclusion in this section.

Lasers are useful in a number of applications, such as data transmission and optical sensing. One type of laser that is used in optical data transmission and in optical sensing applications is a Vertical Cavity Surface Emitting Laser (VCSEL). As its name implies, a VCSEL has a laser cavity with an active region that is sandwiched between and defined by two mirror stacks that include a number of alternating high and low index of refraction layers. In some configurations, light can be extracted through the substrate on the wafer side of the VCSEL, with the "top" mirror totally reflective, and thereby opaque. Emission of light through the substrate is referred to as a bottom emitting VCSEL. For purposes of this invention, the "top" mirror refers to the mirror that reflects the light, the middle is the active region, and the "bottom" refers to the other side of the active region that has the substrate from which light is to be extracted, regardless of how it is disposed in the physical structure.

The subject matter claimed herein is not limited to implementations that solve any disadvantages or that operate only in environments such as those described above. Rather, this background is only provided to illustrate one example technology area where some implementations described herein may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some example embodiments described herein generally relate to a bottom emitting VCSEL.

In some embodiments, a vertical cavity surface emitting laser (VCSEL) can include: a substrate configured for laser light having an emission wavelength to pass therethrough; a first mirror stack between an active region and the substrate; and a reflective end configured to reflect the laser light toward the substrate. The active region is between the first mirror stack and the reflective end. In some aspects, the reflective end includes: a phase matching layer with a phase matching layer thickness; and a first metal layer with a first metal layer thickness, wherein the phase matching layer is between the active region and the first metal layer. The phase matching layer thickness and first metal layer thickness have a combined thickness for the reflective end to have a reflectivity of at least a predetermined reflectivity threshold for the emission wavelength. The reflective end can include a second mirror stack (e.g., top mirror stack) that contributes to the reflectivity. However, the improved reflectivity can be achieved without increasing thickness or mirror periods of the second mirror stack.

In some embodiments, a method of making a vertical cavity surface emitting laser (VCSEL) includes the steps of: providing a substrate; forming a first mirror stack above the substrate; forming an active region above the first mirror stack; and forming a reflective end above the active region, the reflective end having a phase matching layer and a first metal layer. The method can include configuring the phase matching layer and first metal layer to have a combined thickness for the reflective end to have a reflectivity of at least a predetermined reflectivity threshold for an emission wavelength of the VCSEL.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

This application is related to U.S. No. 2018/0198254 (Ser. No. 15/867,546) filed Jan. 10, 2018 and Provisional Ser. No. 62/444,607) filed Jan. 10, 2017 are incorporated herein by specific reference in their entirety.

Generally, the present advancement in VCSEL technology relates to a bottom emitting configuration that includes a contact layer at the top end having a reflective region that reflects the light toward the bottom emitter end. The VCSEL can include a epitaxial semiconductor structure on a substrate, which is configured to pass the light from the bottom surface of the substrate on the bottom of the structure. As such, these types of bottom emitting VCSELs are commonly referred to as bottom emitting VCSELs. As such, reference to a bottom emitting VCSEL as described herein refers to a bottom emitting VCSEL as known in the art. The bottom emitting VCSEL is adapted to pass light from the bottom surface of the substrate, wither oriented downwards, horizontally, or upwards, or any angle therebetween.

A VCSEL can include: a substrate configured for laser light having an emission wavelength to pass therethrough; a first mirror stack between an active region and the substrate; and a reflective end configured to reflect the laser light toward the substrate. The active region is between the first mirror stack and the reflective end. In some aspects, the reflective end includes: a phase matching layer with a phase matching layer thickness; and a first metal layer with a first metal layer thickness, wherein the phase matching layer is between the active region and the first metal layer. The phase matching layer thickness and first metal layer thickness have a combined thickness for the reflective end to have a reflectivity of at least a predetermined reflectivity threshold for the emission wavelength. The reflective end can include a second mirror stack (e.g., top mirror stack) that contributes to the reflectivity. However, the improved reflectivity can be achieved without increasing thickness or mirror periods of the second mirror stack. The second mirror stack can be of a suitable thickness for a bottom emitting VCSEL, such as a thickness that does not result in saturation. The second mirror stack can have a thickness that is less than a thickness that results in saturation. The second mirror stack can have a thickness that provides a maximum reflectivity. The phase matching layer and first metal layer can provide higher reflectivity without changing thickness or number of mirror periods of the second mirror stack.

The top end of the VCSEL (e.g., opposite of the bottom substrate) can include a metal stack that functions as part of the reflective end to reflect the light toward the substrate end. The metal stack can include the first metal layer and at least one second metal layer that is different from the first metal layer. The metal stack can include a metal contact having a first metal layer on the phase matching layer, and then at least a second metal layer. The phase matching layer is between the first metal layer and the active region. The first metal layer is between a second metal layer and phase matching layer. The first metal layer and phase matching layer can have individually selected materials and individually selected thicknesses in order to improve reflection efficiency. The first metal layer can include a metal that is different from the second metal layer or different from the rest of the metal stack that forms the top contact member.

Figure 1A:
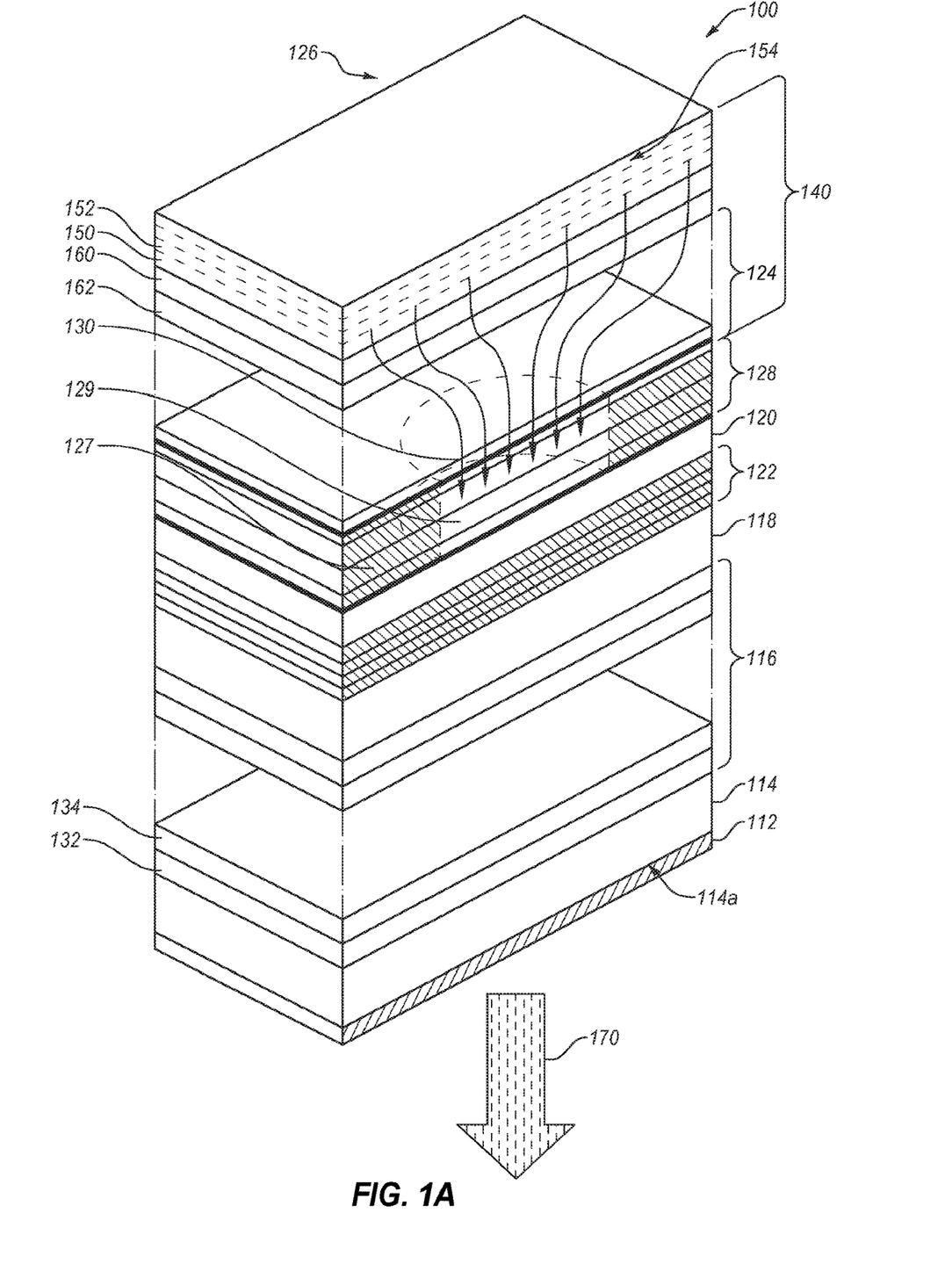
FIG. 1A shows a bottom emitting VCSEL having: a phase matching layer over a top mirror stack; a first metal layer over the phase matching layer; and an end metal region over the first metal layer.

FIG. 1A shows a bottom emitting VCSEL 100 having a bottom substrate 114, a first mirror stack 116, an active region 122, a reflective end 140 in sequence. The reflective end 140 can include a second mirror stack 124, a phase matching layer, and a first metal layer 150. The reflective end 140 may also include a metal end cap 154, which includes at least the first metal layer 150 and second metal layers 152.

As shown, the bottom emitting VCSEL 100 includes the substrate 114 configured to pass laser light 170 having an emission wavelength out of the bottom emitting VCSEL 100 from a substrate end surface 114a. A first mirror stack 116 is positioned between the active region 122 and the substrate 114. The second mirror stack 124 is positioned with the active region 122 between the first mirror stack 116 and the second mirror stack 124. The reflective end 140 is configured to reflect the laser light 170 toward the substrate end surface 114 and out of the substrate end surface 114a as shown by the arrow.

The reflective end 140 is shown to include a second mirror stack 124. The reflective end 140 is shown to include a phase matching layer 160 with a phase matching layer thickness. The reflective end 140 also has a metal end cap 154 with a plurality of metal layers (150, 152) positioned with the phase matching layer 160 between the second mirror stack 124 and a first metal layer 150 of the metal end cap 154. The first metal layer 150 has a first metal layer thickness. The second mirror stack 124 is configured to have high reflectivity to reflect the light generated by the active region. In some aspects, the phase matching layer thickness and first metal layer thickness have a combined thickness that contributes to the reflective end 140 having a reflectivity of at least a predetermined reflectivity threshold for the emission wavelength. That is, the phase matching layer 160 and the first metal layer 150 combined contribute to increasing the reflectivity above that of the second mirror stack 124 to obtain a total reflectivity as described herein.

The bottom emitting VCSEL can include an epitaxial semiconductor structure from the substrate 114 to the metal end cap 154. The epitaxial semiconductor structure can include periodic layer pairs for the first mirror stack 116 (e.g., bottom mirror stack) and the second mirror stack 124 (e.g., top mirror stack). The substrate 114 may include a bottom metal contact layer 112 located thereon (which, if present, will generally have an aperture to allow the laser light to exit). The first mirror stack 116 is formed on substrate 114 and an optional bottom confining layer 118 is formed on the first mirror stack 116. The active region 122 is formed over the first mirror stack 116, or over the bottom confining layer 118 (when present). An optional top confining layer 120 is formed over the active region 122. In one optional aspect, the bottom confining layer 118 (e.g., first confining layer) and a top confining layer 120 (e.g., second confining layer) sandwich the active region 122.

An isolation region 128 can be formed over the active region 122 or over the optional top confining layer 120 as shown; however, the isolation region 128 can be under the active region 122 to be located in a position opposite as shown relative to the active region 122. The isolation region 128 can include a lateral region blocking region 127 and a central conductive channel region 129. The bottom confining layer 118 and/or top confining layer 120 may be a spacer region between the active region 122 and isolation region 128. Alternatively, the bottom confining layer 118 and/or top confining layer 120 may be a conductive region. Thus, any spacer region bounding the active region may be a confining region, conductive region, or semiconductor spacer that is not confining or conducting. The isolation region 128 restricts the area of a current flow 130 through the active region 122. Isolation region 128 can be formed to include the lateral region blocking region 127 and a central conductive channel region 129. The isolation region 128 can include a single layer lateral region blocking region 127 or multiple layers of blocking layers, and/or a single layer central conductive channel region 129 or multiple layers of central conductive channel region layers. In some aspects, the isolation region 128 may be omitted.

The second mirror stack 124 is formed over the isolation region 128 or over the top confining layer 120, or over the active region 122. A top metal end cap 154 forms a contact on a portion over the second mirror stack 124. However, other VCSEL configurations may also be utilized, and various other VCSEL layers or types of layers can be used.

The mirror stacks 116 (first/bottom) and 124 (second/top) can be distributed Bragg reflector (DBR) stacks, and include periodic layers (e.g., 132 and 134 shown for the first mirror stack 116 but omitted in the second mirror stack 124 for clarity). Periodic layers 132 and 134 are typically AlGaAs and AlAs, respectively, but can be made from other III-V semiconductor materials. The first mirror stack 116 and second mirror stack 124 can be doped or undoped and the doping can be n-type or p-type depending on the particular VCSEL design. However, other types of VCSEL mirrors may be used.

Metal contact layer 112 and metal end cap 154 having a metal contact surface 126 can be ohmic contacts that allow appropriate electrical biasing of VCSEL 100. When VCSEL 100 is forward biased with a voltage on metal end cap 154 different than the one on contact 112, active region 122 emits light, which passes through second mirror stack 124 and reflects off of the top reflective end 140, such as reflecting off of the second mirror stack 124, phase matching layer 160 and first metal layer 150 of the top metal end cap 154. The thickness of each of the phase matching layer 160 and first metal layer 150 can be cooperatively configured to maximize or optimize reflectivity over reflectivity obtained by the second mirror stack 124. Those skilled in the art will recognize that other configurations of contacts can be used to generate a voltage across active region 122 and generate light 170 that is passed out of the VCSEL 100 from the substrate 114 and/or through the bottom metal contact layer 112. The top metal end cap 154 includes an end metal region of one or more second metal layers 152 that are of a different material from the first metal layer 150. That is, the first metal layer 150 is a first metal, and the end metal region includes at least a second metal layer 152 that is different from the first metal.

The VCSEL can also include a spacer layer 162 between the second mirror stack 124 and phase matching layer 160.

Figure 1B:
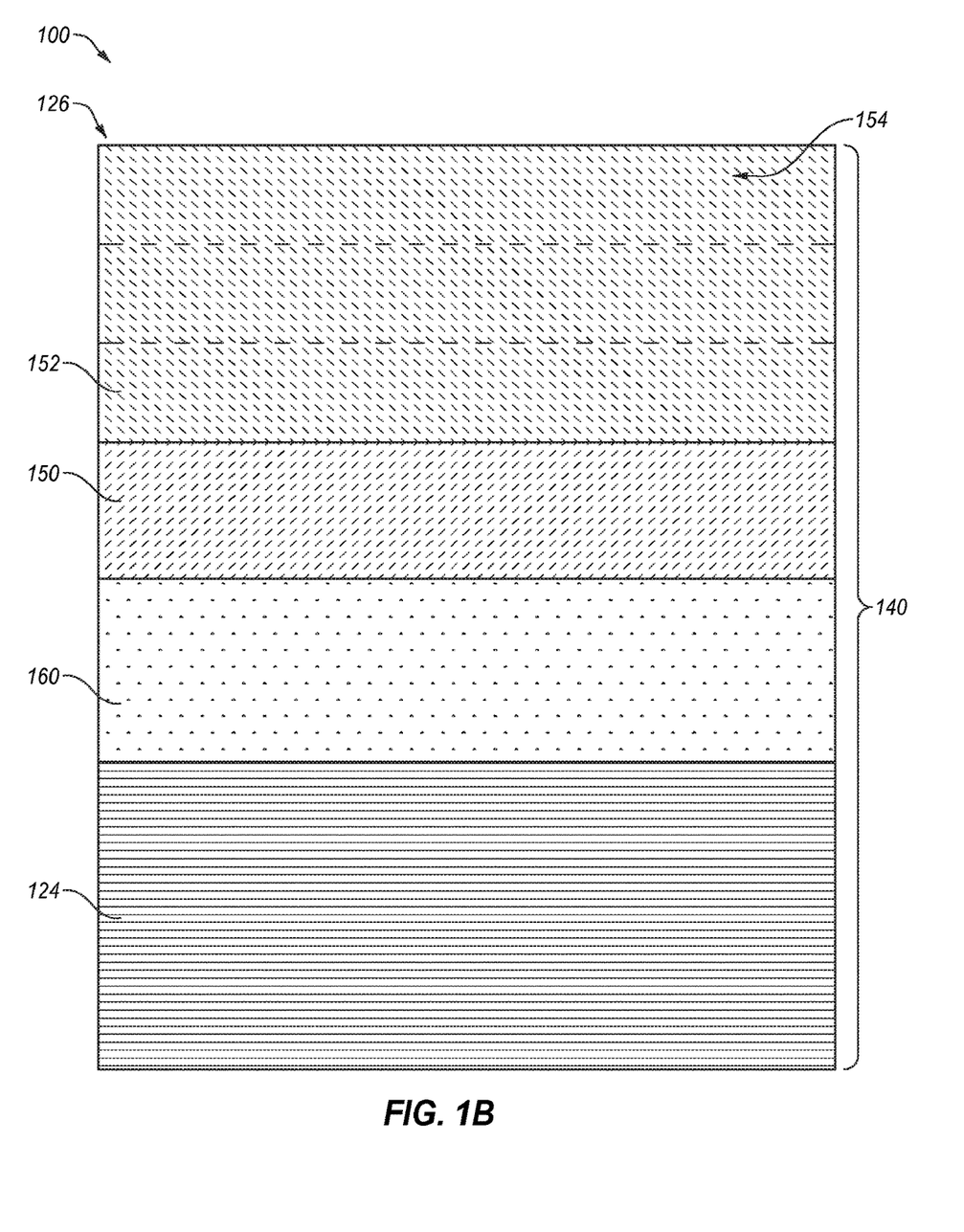
FIG. 1B shows a top region of a bottom emitting VCSEL, where the top reflecting region includes: a phase matching layer over a top mirror stack; a first metal layer over the phase matching layer; and an end metal region over the first metal layer.

FIG. 1B shows a side view of a top end region of the VCSEL 100 that includes the reflective end 140. The first metal layer 150 of the top metal end cap 154 can cover the entirety of the phase matching layer 160. As shown, the second mirror stack 124 is under the phase matching layer 160. The phase matching layer 160 is under the first metal layer 150. The first metal layer 150 is under the end metal region 152 so as to be under the top metal contact surface 126.

In some embodiments, the bottom emitting VCSEL can include a phase matching layer that has a thickness (L) that is generally not a quarter wavelength ($\lambda/4$) of the emission wavelength. That is, in some embodiments the phase matching layer is not a quarter-wave plate. In some aspects, the bottom emitting VCSEL can include a phase matching layer that has a thickness that is generally not an odd integral multiple of the quarter of the emission wavelength. As such, the phase matching layer is not a $L_{\lambda/4}$, $3L_{\lambda/4}$, $5L_{\lambda/4}$, and so on.

In some embodiments, the bottom emitting VCSEL can include a metal stack of at least two metal layers of a reflective end when the phase matching layer has a thickness that is generally not an odd integral multiple of the quarter wavelength of the emission wavelength. Any of the thickness values that are possible omit these values as options for the phase matching layer so that the phase matching layer thickness is not an odd integral multiple of the quarter wavelength of the emission wavelength.

In some embodiments, the bottom emitting VCSEL can include a phase matching layer and first metal layer that are in contact with each other between a top mirror stack and the end contact member. The end contact member can include the metal end cap, which includes the first metal layer and at least one second metal layer of the end metal region. The phase matching layer and first metal layers can have cooperative individual thickness values, such that the thickness of each layer is selected to obtain optimum reflectivity for the wavelength of the laser.

In some embodiments, the phase matching layer can have a thickness that cooperates with a thickness of the first metal layer of the metal end cap in order to provide improved reflectivity. The first metal layer thickness can be at least about 5 nm, at least about 10 nm, at least about 20 nm, at least about 40 nm, at least about 60 nm, at least about nm, at least about 100 nm, or up to 200 nm, or any range between these any of these values. For this range of thickness of the first metal layer, the phase matching layer can have a thickness that ranges from about 40 nm to 110 nm, from about 50 nm to about 100 nm, from about 60 nm to about 80 nm, or about 70 nm, or any range between these any of these values. These values can be larger if the phase matching layer is a dielectric material. In some aspects, the thickness of the phase matching layer can exclude any value that is an odd integral multiple of the quarter wavelength of the emission wavelength.

In some embodiments, the phase matching layer can be a semiconductor, such as GaAs, or other. The phase matching layer can also be a dielectric, such as silicon nitride, but in such a case the top mirror has only optical functions and does not also act as the electrical contact. The first metal layer can be titanium. Accordingly, an example of a phase matching layer and first metal layer combination can be a GaAs and titanium (Ti) combination.

In some embodiments, the material of the phase matching layer can include AlGaAs or can comprise several sublayers of differing composition as an alternative semiconductor (e.g., if comprising multiple layers the total optical thickness of those layers is considered together). The phase matching layer can alternatively include silicon nitride, silicon mono- or di-oxide, aluminum oxide, or other dielectric materials.

In some embodiments, the metal of the first metal layer can include titanium (Ti), tungsten (W), titanium-tungsten (TiW), chromium (Cr), or platinum (Pt), or combinations thereof.

In some embodiments, the phase matching layer and first metal layer combination can include GaAs and Ti combination, GaAs and TiW combination, or AlGaAs and Ti combination.

In some embodiments, the metal of the rest of the top metal end cap, which can function as a top contact layer, such as the end metal region can be one or more second metal layers of platinum (Pt), gold (Au), or some combination of those or other metals (e.g., alloys thereof).

The semiconductor devices of the present invention can be manufactured from any type of semiconductor. Examples of suitable materials include III-V semiconductor materials (e.g., prepared from one or more Group III materials (boron (B), aluminum (Al), gallium (Ga), indium (In), thallium (Tl), and ununtrium (Uut)) and one or more Group V materials (nitrogen (N), phosphorus (P), arsenic (As), antimony (Sb), bismuth (Bi) and ununpentium (Uup) (unconfirmed)) and optionally some type IV materials.

The semiconductor device can include an active region having one or more quantum wells and one or more quantum well barriers. The quantum wells and quantum well barriers can be separated by one or more transitional layers therebetween. The transitional layers may also be referred to as interfacial layers as they are located at the interface between the quantum wells and quantum well barriers. However, the active region can be configured as any known or developed in the art of VCSELs.

Optionally, electrical confining layers can sandwich the active region and provide optical gain efficiency by confining carriers to the active region. The confining layers can have a region of high energy band gap which in the case of many III-V compounds translates to high aluminum content (e.g., 65%-100% Al for the type III material). The aluminum content can be selected to give the material a relatively wide band gap, as compared to the band gap in the quantum well barriers of the active region. The wide band gap material can give the confining layer good carrier confinement and increases the efficiency in the active region. In an exemplary embodiment, the high aluminum region may also include an increase in doping. The confining layer can be doped with a p-type or n-type dopant depending on whether the confinement barrier is on the n-side or p-side of the active region.

The heterojunction conductive channel configuration can provide improved fiber optic transceiver reliability, electro-optical bandwidth, and link distances by allowing implementation of small aperture (e.g., 2-6 µm) VCSEL devices. In high power VCSELs, the heterojunction conductive channel configuration allows higher maximum power per VCSEL, and more emitters per unit area in dense arrays.

This heterojunction conductive channel configuration enables more efficient mass production of guided mode VCSELs by allowing use of one or more MOCVD (metal-organic chemical vapor deposition) crystal growth steps in fabrication. In some aspects, the process can omit lateral steam oxidization, or formation of any oxide aperture.

Figure 2:
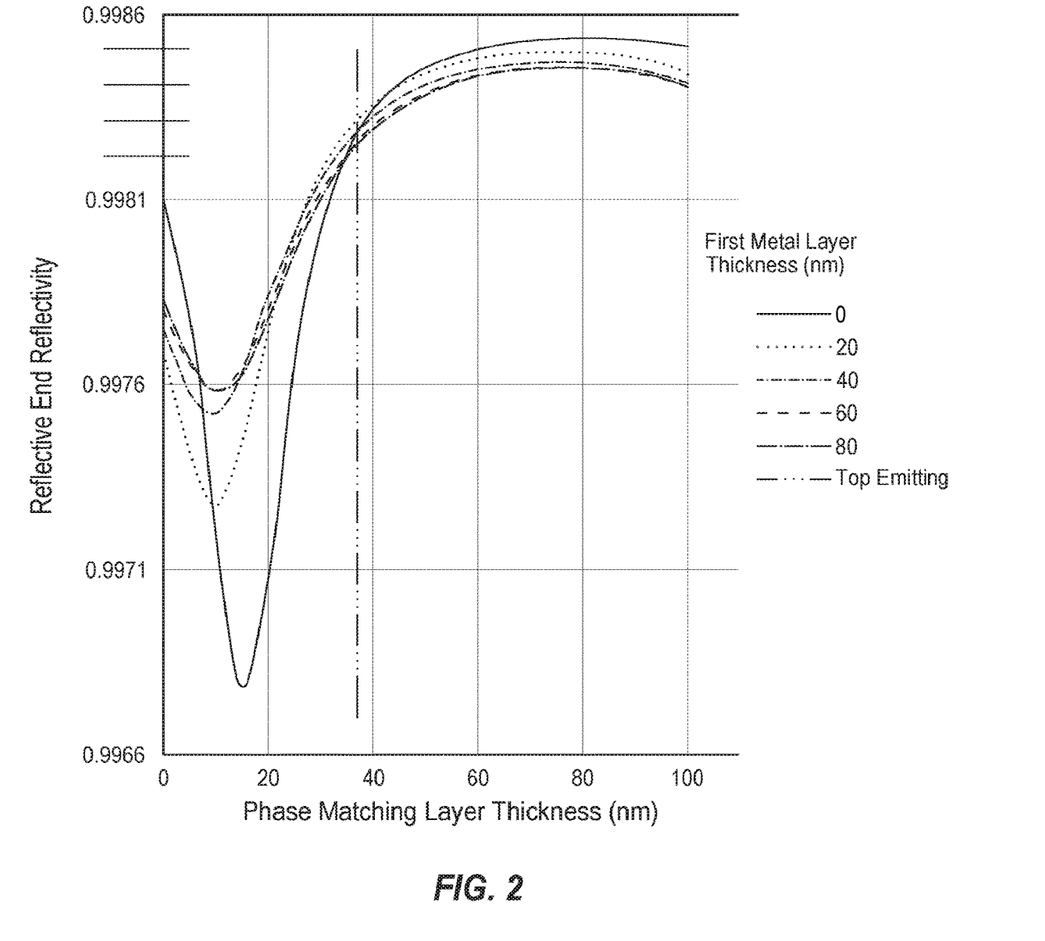
FIG. 2 includes a graph for metal contact-side (e.g., top reflecting region) reflectivity for phase-matching layer thickness versus a top reflecting region reflectivity (top end reflectivity) for individual first metal layer thicknesses.

FIG. 2 includes a graph that shows the reflectivity of the reflective end. As such, the reflectivity for the second mirror, phase matching layer, and first metal layer of the metal end cap is shown versus the phase matching layer thickness for a number of examples of first metal layer thickness, such as 0 nm, 20 nm, 40 nm, 60 nm, and 80 nm.

The graph also includes the vertical line showing the phase matching layer thickness and first metal layer thicknesses that produces maximum reflectivity in a top emitter VCSEL (not bottom emitter VCSEL of the present technology). That is, the vertical line represents a top emitting VCSEL, which emits out of the end opposite of the substrate. It has been found that using the thickness values of the vertical line for the reflective end of a bottom emitting VCSEL for the phase matching layer and first metal layer leads to reduced reflectivity in a bottom emitting VCSEL. As such, the vertical line shows thickness examples that are not used in the bottom emitting VCSEL of the present technology. Instead, the first metal layer thickness is provided in the examples as recited and then the thickness of the phase matching layer is selected to obtain the desired reflective end reflectivity. The phase matching layer thickness value is not on the vertical line, but can be a value higher than the vertical line, such as at least or above 38 nm, preferably over 40 nm.

For this range of thickness values of the first metal layer, the phase matching layer can have a thickness that ranges from about 40 nm to 110 nm, from about 50 nm to about 100 nm, from about 60 nm to about 80 nm, or about 70 nm. While 80 nm is the thickest shown for the first metal layer thickness, the maximum may be at 110 nm or up to 150 or 200 nm. However, it can be preferred that the first metal layer thickness be below 100 nm or about 80 nm or less. The ranges can be between any of the recited examples shown in FIG. 2.

Figure 3:
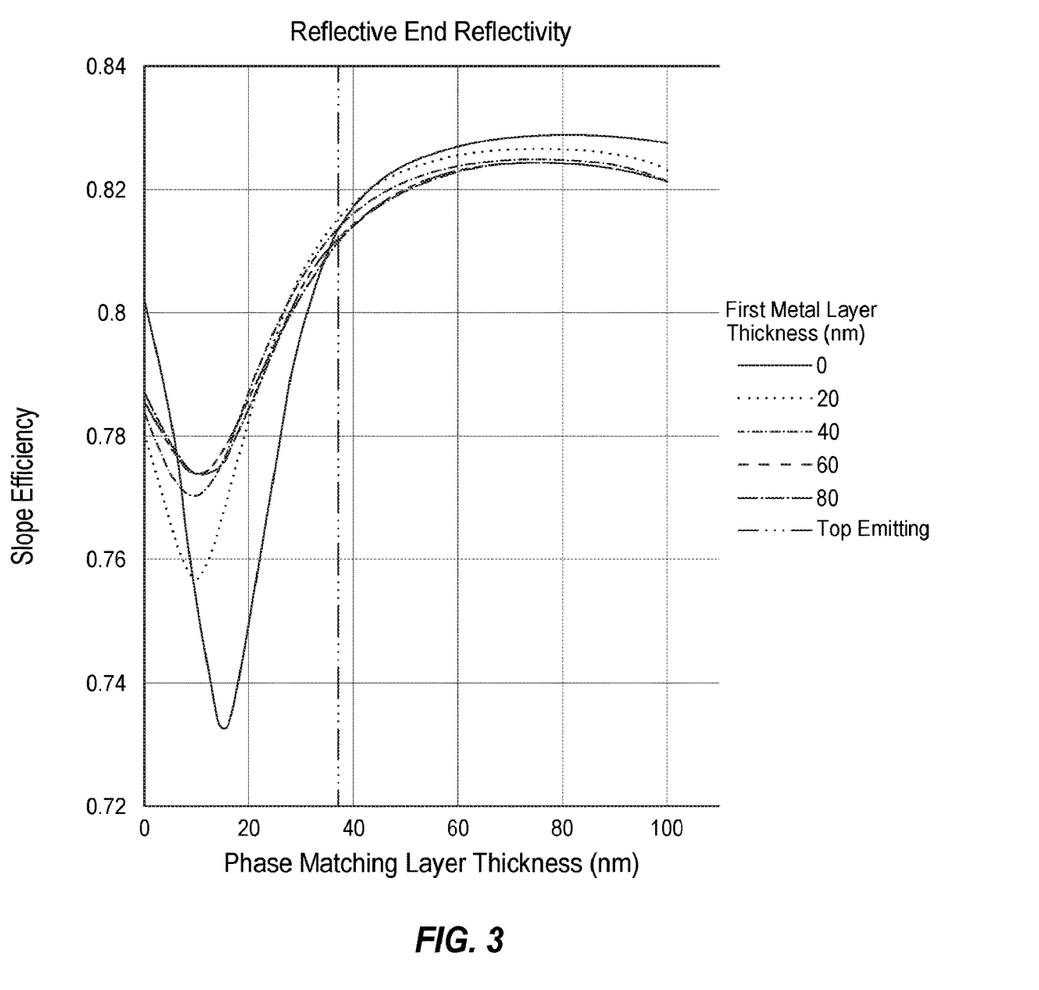
FIG. 3 includes a graph for metal contact-side (e.g., top reflecting region) reflectivity for phase-matching layer thickness versus slope efficiency for individual first metal layer thicknesses.

FIG. 3 includes a graph that shows the slope efficiency of the bottom emitting VCSEL. The slope efficiency of the bottom emitting VCSEL is shown versus the phase matching layer thickness for a number of examples of first metal layer thickness values, such as 0 nm, 20 nm, 40 nm, 60 nm, and 80 nm. The graph also includes the vertical line showing the phase matching layer thickness and first metal layer thicknesses that produces maximum reflectivity in a top emitting VCSEL (e.g., values of thickness of phase matching layer and first metal layer).

The data for FIGS. 2 and 3 were obtained with a bottom emitting VCSEL that includes a bottom substrate of GaAs, a bottom mirror (e.g., first mirror stack) with mirror periods of AlGaAs with 85% Al and GaAs, an active region having InGaAs quantum wells, a top mirror (e.g., second mirror stack) with mirror periods of AlGaAs with 85% Al and GaAs, a phase matching layer of GaAs, a first metal layer of titanium, and the rest of the top metal end cap is platinum (e.g., platinum layers). The metal end cap can be optionally covered with another metal such as gold, with no additional effect on the optical properties. The VCSEL has a wavelength of 940 nm.

Figure 4:
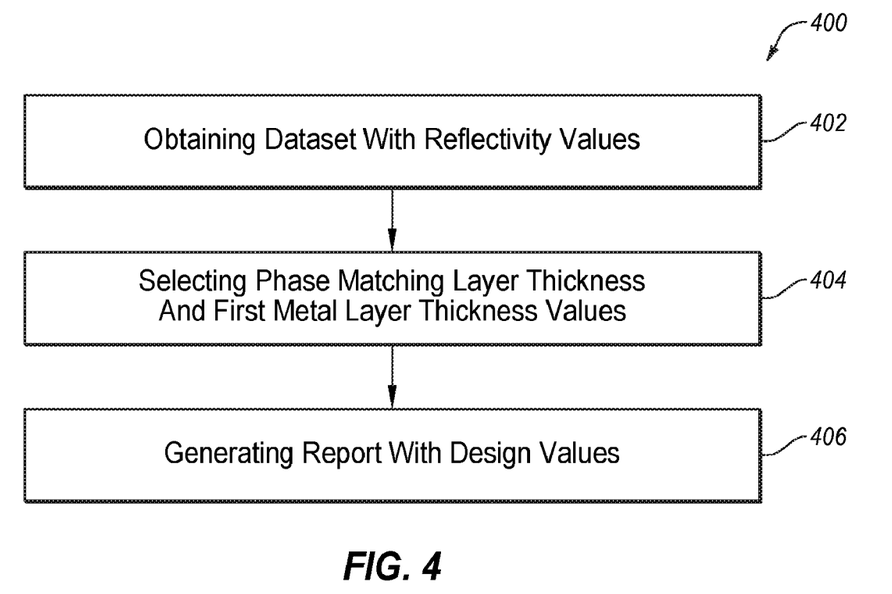
FIG. 4 includes a flowchart of a design method for designing a bottom emitting VCSEL.

In some embodiments, a design method 400 is provided for designing a bottom emitting VCSEL in accordance with the embodiments described herein, as shown in FIG. 4. Such a design method 400 can include the following method steps. The design method 400 can include obtaining a dataset that includes reflectivity values for a bottom emitting VCSEL that is configured to emit laser light with an emission wavelength at block 402. The bottom emitting VCSEL includes a reflective end with a phase matching layer of a phase matching layer thickness and a metal end cap that includes a plurality of metal layers positioned with the phase matching layer between a mirror stack and a first metal layer of the metal end cap. The first metal layer has a first metal layer thickness. The dataset includes the reflectivity values for a plurality of phase matching layer thickness and first metal layer thickness combinations. The design method 400 can include selecting a phase matching layer thickness and first metal layer thickness combination for the reflective end to have a reflectivity of at least a predetermined reflectivity threshold based on the dataset at block 404. The design method 400 can then include generating a report with the selected phase matching layer thickness and first metal layer thickness combination as design values for the substrate emitting VCSEL at block 406.

In some embodiments, a desired reflectivity is determined. As such, the design method can include selecting a reflectivity of a reflectivity range of the reflective end and then selecting the first metal layer thickness for the selected reflectivity. Then, the design method can include identifying the phase matching layer thickness that corresponds with the selected first metal layer thickness for the reflectivity within the reflectivity range based on the dataset. Accordingly, a lookup table, graph, or other data format can be used to identify the phase matching layer thickness based on the selections.

In some embodiments, the design method includes selecting a reflectivity of a reflectivity range of the reflective end and then selecting the phase matching layer thickness for the selected reflectivity. Then, the design method can include identifying the first metal layer thickness that corresponds with the selected phase matching layer thickness to obtain the reflectivity within the reflectivity range based on the dataset. Accordingly, a lookup table, graph, or other data format can be used to identify the first metal layer thickness based on the selections.

In some embodiments, the dataset can be generated. In some aspects, the dataset can be generated by a computer simulation. The computer simulation can be performed for the bottom emitting VCSEL for the plurality of phase matching layer thickness and first metal layer thickness combinations. The simulation can be performed in order to obtain the reflectivity for each phase matching layer thickness and first metal layer thickness combination that is simulated. The simulation then provides the dataset with the reflectivity values for a plurality of set first metal layer thickness values over a range of phase matching layer thickness values. In some aspects, the simulation can be performed to provide the dataset with the reflectivity values for a plurality of set phase matching layer thickness values over a range of first metal layer thickness values.

In some embodiments, the dataset can be generated by preparing and testing physical bottom emitting VCSELs. Such a method can include preparing a plurality of the bottom emitting VCSELs having a plurality of first metal layer thickness values and a plurality of phase matching layer thickness values. The method can include testing the plurality of bottom emitting VCSELs for the reflectivity of the reflective end. Then, the method can include determining the reflectivity of the reflective end for a plurality of set first metal layer thickness values over a range of phase matching layer thickness values. Alternatively, the method can include determining the reflectivity of the reflective end for a plurality of set phase matching layer thickness values over a range of first metal layer thickness values.

The values obtained for the phase matching layer thickness and first metal layer thicknesses to obtain the desired reflectivity can be stored on a computer, or in a database (e.g., memory) of a computer. The computer can then provide a report having the phase matching layer thickness and first metal layer thicknesses for the desired reflectivity to a fabrication system or fabrication controlling computer to control the fabrication to obtain the bottom emitting VCSEL having the phase matching layer thickness and first metal layer thicknesses, and thereby the desired reflectivity.

The bottom emitting VCSEL includes a reflective end with a reflectivity greater than the bottom emitting end. In some aspects, the first mirror region adjacent to the substrate has less mirror periods than the second mirror region adjacent to the reflective end.

The bottom emitting VCSEL is configured to emit light from the substrate into a metal region, such as a contact layer. As such, the metal region can at least partially be translucent or transparent to the light or can have an aperture to allow transmission.

The VCSEL can be configured to have electrical confinement to the center as shown in FIGS. 1A-1B, and may have optical confinement.

In some embodiments, a bottom emitting VCSEL can include: a substrate that releases light therefrom so that the bottom emitting VCSEL emits the light from the substrate; a first mirror stack over the substrate; an active region over the first mirror stack; a second mirror stack over the active region; a phase matching layer over the top mirror stack; a first metal layer over the phase matching layer; and an end metal region over the first metal layer. In some aspects, the phase matching layer and first metal layer each have an individual thickness that is cooperative to provide reflectivity of the top end that is opposite of the substrate. In some aspects, the reflectivity of the top end is at least or greater than about 0.99825, at least or greater than about 0.99830, at least or greater than about at least or greater than about 0.99840, or at least or greater than about 0.99845.

In some embodiments, the phase matching layer thickness is at least or about 40 nm, 42.5 nm, 45 nm, 47.5 nm, 50 nm, 52.5 nm, 55 nm, 57.5 nm, 60 nm, 62.5 nm, 65 nm, 67.5 nm, 70 nm, 72.5 nm, 75 nm, 77.5 nm, 80 nm, 82.5 nm, 85 nm, 87.5 nm, 90 nm, 92.5 nm, 95 nm, 97.5 nm, 100 nm, 102.5 nm, 105 nm, 107.5 nm, 110 nm, or range between any of these values. In some aspects, the phase matching layer is GaAs.

In some embodiments, the first metal layer thickness is at least or about 5 nm, 10 nm, 15 nm, 20 nm, 25 nm, 30 nm, 35 nm, 40 nm, 45 nm, 50 nm, 55 nm, 60 nm, 65 nm 70 nm, 75 nm, 80 nm, 85 nm, 90 nm, 95 nm, 100 nm, 105 nm, 110 nm, or range between any of these values. In some aspects, the first metal layer is titanium.

In some embodiments, the end metal region is platinum or gold.

In some embodiments, the first metal layer thickness and phase matching layer thickness are defined by FIG. 2 having a reflectivity over 0.99825.

In some embodiments, the first metal layer covers the entire phase matching layer. In some aspects, the end metal region covers the entire first metal layer. In some aspects, the first metal layer and/or end metal region are devoid of an aperture.

In some embodiments, the phase matching layer has a thickness that is not an odd integral multiple of a quarter wavelength of an emission wavelength of the bottom emitting VCSEL. In some embodiments, the phase matching layer has a thickness that is not a quarter wavelength of an emission wavelength of the bottom emitting VCSEL.

In some embodiments, the first metal layer and an end metal region are part of a metal stack. In some aspects, the first metal layer and an end metal region are part of a metal stack, wherein the metal stack is part of a top reflecting region, the metal stack, phase matching layer, and top mirror form the top reflecting region.

In some embodiments, the substrate, which is the surface that emits the light, can include an anti-reflective coating.

In some embodiments, the bottom metal contact layer on the substrate is devoid of an aperture.

In some embodiments, the design method can include: selecting a desired range of reflectivity of the reflective end; selecting the phase matching layer thickness; and identifying the first metal layer thickness that corresponds with the phase matching layer thickness to obtain the reflectivity within the range based on the data set. In some aspects, the data set is in a table format or a graphical format.

In some embodiments, the design method can include performing a simulation for determining top end reflectivity for a plurality of set first metal layer thickness values over a range of phase matching layer thicknesses. In some aspects, the design method includes performing a simulation for determining top end reflectivity for a plurality of set phase matching layer thickness values over a range of first metal layer thicknesses. The simulations can be performed on a standard computer with a processor and memory. The memory can have the computer executable instructions for performing the steps of the design method stored on a tangible, non-transitory memory device.

In some embodiments, the design method can include: preparing a plurality of bottom emitting VCSELs having a plurality of first metal layer thicknesses over a range and a plurality of phase matching layer thicknesses over a range; testing the plurality of bottom emitting VCSELs for top end reflectivity; and determining the top end reflectivity for a plurality of set first metal layer thickness values over a range of phase matching layer thicknesses. A report can then be generated with the parameters of the bottom emitting VCSEL. The report can include the phase matching layer thickness value and first metal layer thicknesses value, as well as values for the other structural members.

In some embodiments, the design method can include: preparing a plurality of bottom emitting VCSELs having a plurality of first metal layer thicknesses over a range and a plurality of phase matching layer thicknesses over a range; testing the plurality of bottom emitting VCSELs for top end reflectivity; and determining the top end reflectivity for a plurality of set phase matching layer thickness values over a range of first metal layer thicknesses.

Figure 5:
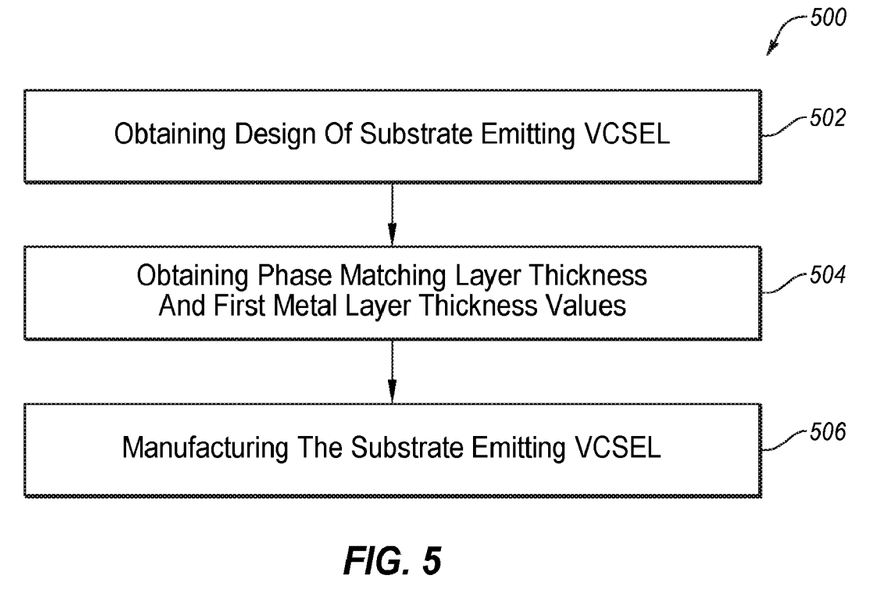
FIG. 5 includes a flowchart of a fabrication method for manufacturing a bottom emitting VCSEL.

FIG. 5 includes a flowchart for a method 500 of fabricating a bottom emitting VCSEL, which can include obtaining a design of a bottom emitting VCSEL configured to pass laser light having an emission wavelength through a substrate end surface at block 502. The design can be obtained by performing the design method, such as described herein. The substrate emitting VCSEL can include a reflective end configured to reflect laser light toward the substrate end surface, such as in the embodiments described herein. The fabrication method 500 can include obtaining a value for the phase matching layer thickness and a value for the first metal layer thickness that provides the reflective end with a reflectivity of at least a predetermined reflectivity threshold for the emission wavelength at block 504. Then the fabrication method 500 can include manufacturing the bottom emitting VCSEL to have a phase matching layer thickness and first metal layer thickness combination that produces the reflectivity at block 506.

The fabrication matehood 500 can include the steps of forming the individual layers and regions of the bottom emitting VCSEL for block 506. As such, block 506 can include: providing a substrate; forming a first mirror stack above the substrate; forming an active region above the first mirror stack; and forming a reflective end above the active region, the reflective end having a phase matching layer and a first metal layer. The phase matching layer and first metal layer are formed to have a combined thickness for the reflective end to have a reflectivity of at least a predetermined reflectivity threshold for an emission wavelength of the VCSEL. The method can also include forming the reflective end so that the predetermined reflectivity threshold is at least about 0.99825. The method can also include forming the phase matching layer to have a thickness from about 40 nm to about 110 nm and/or forming the first metal layer to have a thickness from about 5 nm to about 110 nm. The method can also include forming the phase matching layer with GaAs or AlGaAs and/or forming the first metal layer with Ti, W, Cr, Pt or TiW. The method can also include forming the first metal layer to be devoid of an aperture, or where the phase matching layer and second metal layer also are devoid of an aperture. The method can also include forming the phase matching layer to have a phase matching layer thickness that is not a quarter wavelength of the emission wavelength. The method can also include forming the phase matching layer to have a phase matching layer thickness that is not an odd integral multiple of a quarter wavelength of the emission wavelength. The method can also include forming a second mirror stack positioned between the active region and the phase matching layer. The method can also include forming at least one second metal layer above the first metal layer, wherein the first metal layer is a first metal and each second metal layer is a second metal that is different from the first metal.

In some embodiments, the manufacturing process can include forming a substrate on a metal contact layer, growing a first mirror region having a plurality of first mirror layers having one or more indices of refraction, and then (optionally) growing a first spacer region over the first mirror region. Then an active region is grown over the first spacer region (or over the first mirror when a first spacer region is not grown). Then an optional second spacer region is grown over the active region. Then an isolation region is grown and formed over the second spacer region (or the active region when the second spacer region is not grown). Then the process includes growing a second mirror region having a plurality of second mirror layers having one or more indices of refraction. The phase matching layer with the selective thickness is grown over the second mirror region. Then, the first metal layer is formed on the phase matching layer to have a thickness that is cooperative with the thickness of the phase matching layer. Then, the rest of the layers of the top contact metal are formed.

Also, the active region or whole semiconductor layers of a VCSEL can be produced with molecular beam epitaxy (MBE). Lower growth temperatures during the MBE can be used to prepare the VCSEL semiconductor layers. The growth of these structures by MBE can be performed at <(less than) 500° C. Comparatively, the temperatures for MOCVD can be >(greater than) 600° C. Additionally, the VC SELs can be prepared by methods that are similar to MBE, such as GSMBE (gas source MBE) and MOMBE (metalorganic MBE) or the like that can produce the regions as described.

In some embodiments, a method is provided for emitting light from a bottom emitting VCSEL. The method can include: providing the bottom emitting VCSEL of one of the embodiments; and emitting light from the bottom.

Unless specific arrangements described herein are mutually exclusive with one another, the various implementations described herein can be combined to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A vertical cavity surface emitting laser (VCSEL) comprising:
    a substrate configured for laser light having an emission wavelength to pass through;
    a first mirror stack, between an active region and the substrate, having a first reflectivity for the emission wavelength;
    a plurality of confining layers sandwiching the active region, each having a first band gap wider than a second band gap in quantum well barriers of the active region;
    an isolation region positioned between the active region and the substrate, the isolation region having a lateral blocking region surrounding a central channel conductive region; and
    a reflective end configured to reflect laser light toward the substrate, wherein the active region is between the first mirror stack and the reflective end, and the reflective end includes:
        a phase matching layer with a phase matching layer thickness from about 40 nm to about 110 nm;
        a first metal layer of a first metal with a first metal layer thickness from about 5 nm to about 110 nm, wherein the phase matching layer is between the active region and the first metal layer; and
        at least one second metal layer, each of the at least one second metal layer comprising a second metal different from the first metal, wherein the first metal layer is between the phase matching layer and the at least one second metal layer,
    wherein the phase matching layer thickness and the first metal layer thickness are such that the reflective end has a second reflectivity for the emission wavelength that is greater than the first reflectivity and is at least 0.99825.

2. The VCSEL of claim 1,
    wherein the phase matching layer is GaAs or AlGaAs, and
    wherein the first metal layer is Ti, W, Cr, Pt or TiW.

3. The VCSEL of claim 1, wherein the region of high energy band gap material includes an aluminum content within a range of 65%-100%.

4. The VCSEL of claim 1, wherein the first metal layer is devoid of an aperture.

5. The VCSEL of claim 1, wherein a thickness of the phase matching layer is not a quarter wavelength of an emission wavelength of the VCSEL.

6. The VCSEL of claim 1, wherein a thickness of the phase matching layer is not an odd integral multiple of a quarter wavelength of an emission wavelength of the VCSEL.

7. The VCSEL of claim 1, wherein the reflective end further comprises a second mirror stack positioned between the active region and the phase matching layer.

8. The VCSEL of claim 1, wherein the phase matching layer is GaAs or AlGaAs.

9. The VCSEL of claim 1, wherein the first metal layer is Ti, W, Cr, Pt or TiW.

10. The VCSEL of claim 1, wherein each second metal layer is Pt, Au, or alloy thereof.

11. A method of making a vertical cavity surface emitting laser (VCSEL) comprising the steps of:
    providing a substrate configured for laser light having an emission wavelength to pass through;
    forming a first mirror stack above the substrate having a first reflectivity for the emission wavelength;
    forming an isolation region above the first mirror stack, the isolation region having a lateral blocking region surrounding a central channel conductive region;
    forming an active region above the isolation region;
    forming a plurality of confining layers sandwiching the active region, each having a first band gap wider than a second band gap in quantum well barriers of the active region; and
    forming a reflective end above the active region by:
        forming a phase matching layer having a phase matching layer thickness from about 40 nm to about 110 nm,
        forming a first metal layer of a first metal above the phase matching layer having a first metal layer thickness from about 5 nm to about 110 nm, and
        forming at least one second metal layer, each of the at least one second metal later comprising a second metal different from the first metal above the first metal layer,
    wherein the phase matching layer thickness and the first metal layer thickness are such that the reflective end has a second reflectivity for the emission wavelength that is greater than the first reflectivity and is at least 0.99825.

12. The method of claim 11, comprising:
    forming the phase matching layer with GaAs or AlGaAs; and
    forming the first metal layer with Ti, W, Cr, Pt or TiW for the first metal.

13. The method of claim 11, wherein the region of high energy band gap material includes an aluminum content within a range of 65%-100%.

14. The method of claim 11, comprising forming each of the at least one second metal layer with Pt, Au, or alloy thereof for the second metal.

15. The method of claim 11, further comprising forming the first metal layer to be devoid of an aperture.

16. The method of claim 11, further comprising forming the phase matching layer to have a phase matching layer thickness that is not a quarter wavelength of an emission wavelength of the VCSEL.

17. The method of claim 11, further comprising forming the phase matching layer to have the phase matching layer thickness that is not an odd integral multiple of a quarter wavelength of an emission wavelength of the VCSEL.

18. The method of claim 11, further comprising forming a second mirror stack positioned between the active region and the phase matching layer.

19. The method of claim 11, wherein the isolation region is positioned between the active region and the substrate.

20. The method of claim 11, wherein the plurality of confining layers are positioned to contact opposing sides of the active region.

21. A vertical cavity surface emitting laser (VCSEL) for outputting laser light having an emission wavelength, the VCSEL comprising:

a substrate;
an output mirror stack, above the substrate, having a first reflectivity for the emission wavelength;
an active region above the output mirror stack;
a reflective end, above the active region, comprising:
 a phase matching layer having a phase matching layer thickness from about 40 nm to about 110 nm;
 a first metal layer, above the phase matching layer, comprising a first metal having a first metal layer thickness from about 5 nm to about 110 nm; and
 at least one second metal layer, above the first metal layer, comprising a second metal different from the first metal,
wherein the phase matching layer thickness and the first metal layer thickness are such that the reflective end has a second reflectivity for the emission wavelength that is greater than the first reflectivity and is at least 0.99825.

\* \* \* \* \*